United States Patent
Koehler et al.

(10) Patent No.: US 9,651,642 B2
(45) Date of Patent: May 16, 2017

(54) MAGNETIC RESONANCE SYSTEM AND METHOD TO ACQUIRE MR DATA AND TO DETERMINE A B1 MAGNETIC FIELD

(71) Applicants: Michael Koehler, Nuremberg (DE); Thorsten Speckner, Erlangen (DE)

(72) Inventors: Michael Koehler, Nuremberg (DE); Thorsten Speckner, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 646 days.

(21) Appl. No.: 14/169,620

(22) Filed: Jan. 31, 2014

(65) Prior Publication Data
US 2014/0218022 A1 Aug. 7, 2014

(30) Foreign Application Priority Data
Feb. 1, 2013 (DE) ........................ 10 2013 201 671

(51) Int. Cl.
*G01R 33/54* (2006.01)
*G01R 33/24* (2006.01)

(52) U.S. Cl.
CPC ........... *G01R 33/54* (2013.01); *G01R 33/246* (2013.01)

(58) Field of Classification Search
CPC .... G01R 33/54; G01R 33/246; G01R 33/443; A61B 5/055
See application file for complete search history.

(56) References Cited

U.S. PATENT DOCUMENTS

| | | | |
|---|---|---|---|
| 5,379,766 A * | 1/1995 | McKinnon | G01R 33/5673 324/309 |
| 6,078,176 A | 6/2000 | McKinnon | |
| 6,127,825 A | 10/2000 | Goto | |
| 8,198,891 B2 | 6/2012 | Sacolick et al. | |
| 2003/0218459 A1 | 11/2003 | Reddy et al. | |
| 2004/0164737 A1 | 8/2004 | Feiweier | |
| 2006/0080044 A1 | 4/2006 | Ropele | |

(Continued)

FOREIGN PATENT DOCUMENTS

| | | |
|---|---|---|
| CN | 101162262 A | 4/2008 |
| EP | 2615470 A1 | 1/2012 |
| EP | 2 508 910 A2 | 10/2012 |

OTHER PUBLICATIONS

"Handbook of MRI Pulse Sequences," Bernstein et al., (2004), pp. 266-267 and 350-351.

(Continued)

*Primary Examiner* — Rodney Bonnette
(74) *Attorney, Agent, or Firm* — Schiff Hardin LLP

(57) ABSTRACT

In a method and magnetic resonance (MR) system to acquire MR data within a volume segment, the MR data are repeatedly acquired with a sequence that which includes the following steps. A first resonant RF pulse is radiated and a second resonant RF pulse is radiated. A dephasing first gradient is applied after the first resonant RF pulse and before the second resonant RF pulse. A third resonant RF pulse is radiated after the second resonant RF pulse. A second gradient is applied after the third RF pulse in order to refocus a stimulated echo of a magnetization component prepared by the first gradient. MR data are read out, and a fourth resonant RF pulse is radiated after the readout of the MR data, to reduce the longitudinal magnetization.

16 Claims, 4 Drawing Sheets

(56) References Cited

U.S. PATENT DOCUMENTS

| | | | |
|---|---|---|---|
| 2013/0249548 A1* | 9/2013 | Stemmer | G01R 33/543 |
| | | | 324/309 |
| 2014/0043025 A1 | 2/2014 | Wang et al. | |
| 2014/0070805 A1 | 3/2014 | Van Der Meulen et al. | |
| 2014/0218021 A1* | 8/2014 | Koehler | G01R 33/443 |
| | | | 324/301 |
| 2015/0002149 A1* | 1/2015 | Nehrke | G01R 33/243 |
| | | | 324/309 |
| 2016/0223635 A1* | 8/2016 | Den Harder | G01R 33/246 |

OTHER PUBLICATIONS

"Dream—A Novel Approach for Robust, Ultrafast, Multislice B1 Mapping," Nehrke et al., Magnetic Resonance in Medicine, vol. 68 (2012), pp. 1517-1526.

"Dream—A Novel Approach for Robust, Ultra-Fast, Multi-Slice B1 Mapping," Nehrke et al., Proc. Intl. Soc. Mag. Reson. Med., vol. 20 (2012) p. 605.

\* cited by examiner

MAGNETIC RESONANCE SYSTEM AND METHOD TO ACQUIRE MR DATA AND TO DETERMINE A B1 MAGNETIC FIELD

BACKGROUND OF THE INVENTION

Field of the Invention

The present invention concerns a method in order to acquire magnetic resonance (MR) data (for example to create MR images) and a method in order to determine a B1 magnetic field. Moreover, the present invention concerns a magnetic resonance system that is designed in order to implement one or both of such methods.

Description of the Prior Art

Precise knowledge of the B1 magnetic field, which is the strong, static field that is present in the examined region of the examination subject, is of great importance for many applications in the field of magnetic resonance tomography, for example for the calculation of an RF pulse in multichannel transmission operation or for quantitative T1 examinations. In a strong, static B0 magnetic field (for example of a strength of 3 Tesla or more), distinctive spatially dependent variations of the B1 magnetic field can occur due to subject-specific variations in conductivity and susceptibility. Therefore, a subject-specific determination of the actual B1 magnetic field that is present is indispensable for many applications given a defined, set transmission power.

One possibility to determine the actual B1 magnetic field is offered by what is known as the DREAM method ("Dual Refocusing Echo Acquisition Mode") as described in "DREAM—A Novel Approach for Robust, Ultra-Fast, Multi Slice B1 Mapping", K. Nehrke et al., Magn. Reson. Med. 20 (2012): Page 605. As will be explained in more detail in the following, the B1 amplitude of the B1 magnetic field generated by resonant RF pulses is determined in DREAM depending on intensities of a stimulated echo and a gradient echo.

In other known MR methods with which MR images are generated, a stimulated echo is generated that is detected upon readout of the MR data. A problem can occur that a magnetization prepared in a previous sequence negatively affects or adulterates the MR data acquired for a current sequence. For example, artifacts can occur in an MR image reconstructed from the MR data. If such an MR method based on the stimulated echo is used to determine the B1 magnetic field, in particular the intensity of the gradient echo is disadvantageously adulterated (more precisely, increased) due to this problem, such that the determination of the B1 magnetic field is also adulterated.

SUMMARY OF THE INVENTION

An object of the present invention therefore is to at least alleviate these problems for general MR methods that are based on the stimulated echo, and in particular in methods to determine a B1 magnetic field.

Within the scope of the present invention, a method is provided to acquire MR data within a volume segment with a magnetic resonance system. This method repeatedly uses a sequence to acquire the MR data, this sequence including the following steps:

Radiate a first resonant RF pulse.
Radiate a second resonant RF pulse.
Apply a dephasing first magnetic field gradient which is applied after the first resonant RF pulse and before the second resonant RF pulse.
Radiate a third resonant RF pulse which is radiated after the second RF pulse.
Apply a second magnetic field gradient which is applied after the third RF pulse in order to refocus a stimulated echo of a magnetization component prepared by the first gradient. This second magnetic field gradient is adapted to the first magnetic field gradient so that the polarity of both magnetic field gradients is the same, for example.
Read out MR data.
Radiate a fourth resonant RF pulse which is radiated after the readout of the MR data in order to reduce the longitudinal magnetization.

As used herein, an application of a magnetic field gradient means the application of a magnetic field gradient moment. A gradient or a gradient moment can have components in one, two or even in all three spatial directions. Expressed differently, both the first gradient and the second gradient can be effective on all spatial axes. Moreover, both the first gradient moment (i.e. the gradient moment generated by the first gradient) and the second gradient moment (i.e. the gradient moment generated by the second gradient) can be added to gradient moments that are components of the sequence for other reasons.

Longitudinal magnetization is converted into transverse magnetization by the radiation of the fourth resonant RF pulse, which has a relatively large deflection angle or flip angle (for example 80° to 90°). The remaining prepared longitudinal magnetization from a preceding acquisition is thereby reduced, so an adulteration in subsequent measurements is advantageously reduced or even completely prevented. Previously described problems with regard to image artifacts are thereby also advantageously suppressed.

Expressed differently, because the fourth resonant RF pulse is radiated at the end of the respective sequence in successive sequences or acquisitions, upon readout of the MR data only the echo of that (longitudinal) magnetization component, which was also prepared in the same sequence or acquisition (by the first gradient moment), is refocused. Thus at the point in time of the readout of the current sequence, only the stimulated echo is detected that originates from the (longitudinal) magnetization component, that was prepared in the associated preparation portion of the sequence. An adulteration of the measured MR data is therefore prevented or at least reduced, so image artifacts in MR images created from the MR data are advantageously likewise at least reduced.

In order to cause only the stimulated echo that originates from that magnetization component that was prepared during the current sequence to be detected at the point in time of the readout of the current sequence, the first gradient or the first gradient moment and the second gradient or the second gradient moment must be adapted to one another, or have a defined relationship. For example, the second gradient moment can be of equal magnitude or somewhat greater than the first gradient moment. It is normally the case that an increase (or reduction) of the first gradient moment by a determined percentile leads to an increase (or reduction) of the second gradient moment by the same percentile. The relationship between the two gradient moments is dependent on the temporal length of the readout of the MR data.

According to the invention, the volume segment in which the B1 magnetic field should be determined can include a slice, or can be a slice. In this case, respective slice selection gradient is applied during the first resonant RF pulse, during the second resonant RF pulse, during the third resonant RF pulse, and also during the fourth resonant RF pulse, such that the resonant RFD pulses essentially affect only the nuclear spins of the slice.

However, according to the invention it is also possible for the first, second, third and fourth resonant RF pulses to respectively excite a three-dimensional volume segment.

In other words: the present invention is usable both in two-dimensional (slice-by-slice) acquisition of the MR data, as well as in three-dimensional acquisition of the MR data.

According to a preferred embodiment of the invention, after the second resonant RF pulse and before the third resonant RF pulse, a spoiler gradient is applied with which transverse components of the magnetization are dephased.

The transverse components of the magnetization may be so strongly dephased by the spoiler gradient, or by the spoiler gradient moment, such that these magnetization components virtually no longer contribute to the signal or to the result upon readout of the MR data.

For similar reasons, it is advantageous to apply an additional strong spoiler gradient directly after the fourth resonant RF pulse (thus before the beginning of a subsequent sequence) in order to dephase the longitudinal magnetization converted into the transverse magnetization, so that it no longer contributes to a measurement signal in the following acquisitions.

In particular, the steps of radiation of the third resonant RF pulse, application of the second magnetic field gradient, and readout, are implemented multiple times before the fourth RF pulse is radiated.

The first and the second resonant RF pulses can each have a flip angle of 90° for the acquisition of the MR data. As is explained in more detail in the following, to determine the B1 magnetic field it can be advantageous to use other flip angles for the first and/or second resonant RF pulses.

By the use of a first resonant RF pulse with a flip angle of 90°, the magnetization is deflected optimally strongly (in comparison to other flip angles) into the transverse plane (orthogonal to the longitudinal direction). A second resonant RF pulse with a flip angle of 90° similarly ensures that the magnetization is flipped again into the longitudinal direction. When the flip angle of each of the first resonant RF pulses is 90°, a maximum portion of the original magnetization is deflected into the transverse plane and can be dephased with the first gradient. When the second resonant RF pulse has a flip angle of 90°, the entire magnetization that was dephased or prepared by the first gradient is converted into the longitudinal magnetization component (and essentially remains there until it is converted again into transverse magnetization by the third resonant RF pulse).

However, a flip angle of 90° cannot always be achieved, for example due to inhomogeneities. Therefore, it is explicitly noted that the present invention does not require that the first and second resonant RF pulses must have a flip angle of 90°.

If the two resonant RF pulses have a flip angle differing from 90°, a defined proportion of the magnetization component that is present before the radiation of the respective resonant RF pulse remains. The greater the deviation of the actual flip angle of the first or the second resonant RF pulse from 90°, the more that a magnetization prepared in the previous sequence influences the stimulated echo of the current sequence.

According to the invention, it is also possible for the first gradient and/or the second gradient in a defined sequence to be different from the first or second gradient of an additional sequence that chronologically directly follows the defined sequence. In other words: the first gradient of the additional sequence differs from the first gradient of the defined sequence and/or the second gradient of the additional sequence differs from the second gradient of the defined sequence. If both the first and second gradient are changed, a difference moment, by which the gradient moment generated by the first gradient of the defined sequence differs from the gradient moment generated by the first gradient of the additional sequence, is preferably equal to a difference moment by which the gradient moment generated by the second gradient of the defined sequence differs from the gradient moment generated by the second gradient of the additional sequence.

In that the first gradient or the first gradient moment and/or the second gradient or the second gradient moment is/are set differently in successive sequences or acquisitions, preferably only the echo of that (longitudinal) magnetization component which was also prepared in the same sequence or acquisition (by the first gradient moment) is refocused in the readout of the MR data. Longitudinal magnetization components of preceding sequences have different dephasings and are advantageously not refocused upon readout of the current sequence. In other words, at the point in time of the readout of the current sequence, only the stimulated echo is acquired that originates from the (longitudinal) magnetization component that was prepared in the associated preparation portion of the sequence. An adulteration of the measured MR data is therefore prevented or at least reduced, and image artifacts in the MR images created from the MR data are likewise at least reduced.

Within the scope of the present invention, a method is also provided to determine the B1 magnetic field within a volume segment of a magnetic resonance system. The method according to the invention for the determination of the B1 magnetic field uses the method according to the invention for the acquisition of MR data in order to determine a first signal intensity of the stimulated echo and a second signal intensity of a gradient echo, or an echo of a free induction decay. For this purpose, after the second magnetic field gradient, a third magnetic field gradient is applied with a polarity opposite the second magnetic field gradient in order to refocus both the stimulated echo and the gradient echo (echo of the free induction decay). The first signal intensity of the stimulated echo and the second signal intensity of the gradient echo are determined upon readout of the MR data. The amplitude of the B1 magnetic field that is generated by the first resonant RF pulse and the second resonant RF pulse is determined depending on the first and second signal intensities.

With the use of the following Equation (1), the deflection angle $\alpha$ caused by the first and second RF pulse can be calculated from the ratio of the first signal intensity $I_1$ of the stimulated echo and the second signal intensity $I_2$ of the gradient echo.

$$\alpha = \arctan\left(\sqrt{2 \times \frac{I_1}{I_2}}\right) \quad (1)$$

With the use of the following Equation (2), the B1 amplitude of the magnetic field generated by the appertaining first or second resonant RF pulse can be calculated from the deflection angle $\alpha$ that is calculated in such a manner.

$$\alpha = \gamma \int B_1(t) \quad (2)$$

Wherein $\gamma$ designates the gyromagnetic ratio and B1(t) is the time curve of the B1 magnetic field that is caused by the first and second RF pulses. Given a known pulse shape of the two RF pulses, the B1 amplitude of the B1 magnetic field generated by the two RF pulses can accordingly be calculated with the use of Equations (1) and (2).

When, to determine the amplitude of the B1 magnetic field at the end of a sequence (or between two sequences), according to the invention the fourth resonant RF pulse is radiated following a spoiler gradient, the prepared longitudinal magnetization that remains from this sequence is advantageously reduced, so an adulteration in a subsequent measurement or sequence is reduced or prevented.

The first and second resonant RF pulses preferably have the same target flip angle or target deflection angle, which is preferably in a range from 45° to 65° (best at 55°). In this range, the signal intensities of the stimulated echo and the echo of the free induction decay are essentially of the same magnitude.

With Equation (1), the B1 magnetic field can be calculated particularly simply if the first and second RF pulses cause the same flip angle. If the two RF pulses cause different flip angles, the B1 magnetic field can also be determined according to the invention on the basis of Equation (1). From Equation (1) it is clear that an unambiguous determination of the deflection angle of the first or second resonant RF pulse is limited to a range from 0° to 90°. If the target deflection angle is in the range described above, the statistical errors in the measurement of the actual deflection angle is minimal. The target deflection angle is that angle by which the longitudinal magnetization is flipped if the B1 magnetic field is homogenous in the entire volume segment. The actual deflection angle corresponds to that angle by which the longitudinal magnetization is actually flipped, for example due to the subject-specific or location-specific conductivity and/or susceptibility. In other words: the target deflection angle or, respectively, target flip angle differs from the deflection angle or, respectively, flip angle that is actually achieved or, respectively, caused.

The target deflection angle or target flip angle of the fourth resonant RF pulse is preferably set to a value of 90° since, given a deflection angle of 90°, the longitudinal magnetization is completely converted into transverse magnetization and can then be dephased ("spoiled") by the spoiler gradient.

However, the actual deflection angle can markedly deviate from the target deflection angle (thus markedly deviate from 90° in the example described in the preceding) due to local B1 variations. Therefore, it is proposed to select the target deflection angle of the fourth resonant RF pulse so that it is equal to or somewhat greater than the target deflection angle of the first and second resonant RF pulse.

The closer that the actual deflection angle of the first and second resonant RF pulse approaches the value of 90°, the greater the proportion of the magnetization prepared by the sequence that is converted back by the second resonant RF pulse. In other words: the problem to be solved by the present invention is more effective the more that the actual deflection angle of the first and second resonant RF pulses approaches an angle of 90°. However, because the target deflection angle of the fourth resonant RF pulse is chosen to be equal to or greater than the target deflection angle of the first and second resonant RF pulses, the effectiveness of the fourth resonant RF pulse is enhanced.

When the first and second RF pulses produce a deflection angle of 90°, this can have negative effects on the precision of the method according to the invention. If the first and second RF pulse cause a deflection angle of up to 80°, the negative effects on the precision of the method according to the invention should be kept within limits. In this case, a final RF pulse with an excitation angle of 90° still offers an effective improvement with regard to the elimination of a prepared longitudinal magnetization that remains from a preceding acquisition.

The first, second and third gradient moments are adapted to one another. It is normally the case that an increase (or decrease) of the first gradient moment and the second gradient moment by a defined percentile leads to an increase (or decrease) of the third gradient moment by the same percentile. For example, the relationship between the three gradient moments is also dependent on the temporal length of the readout of the MR data. However, it is also possible for the third gradient moment to remain unchanged if the first and/or second gradient moments are varied. Moreover, the first, second and third gradient moments are effective in the same spatial direction (i.e. pertain to the same spatial axis).

To the extent that, according to the invention, a prepared component and unprepared longitudinal component exist after the preparation, the signals of the two magnetization components can be refocused in chronological succession so that two time-offset echoes (stimulated echo and gradient echo) result after every third resonant RF pulse (the readout RF pulse). Because both the stimulated echo and the gradient echo are refocused in a single acquisition, advantageously only a single acquisition is required in order to determine the B1 amplitude. Due to this fast determination of the B1 amplitude, the method according to the invention also has a low movement sensitivity.

If the magnetic resonance system to execute the inventive method has multiple transmission channels or multiple RF transmission antennas, the RF pulses of one sequence are respectively radiated by the same group of transmission channels or RF transmission antennas in order to measure or determine the B1 magnetic field generated by this group. The corresponding group can also be formed by only one transmission channel or by only one RF transmission antenna. The RF pulses in the readout portion can also be radiated by all transmission channels, which in principle also applies to the final RF pulse.

With this procedure it is advantageously possible to determine the B1 magnetic field for an arbitrary configuration of transmission channels (for example individually for each transmission channel or for an arbitrary combination of multiple transmission channels).

For example, the method according to the invention for the determination of the B1 magnetic field can be implemented N times in order to determine the B1 magnetic field for N configurations of the transmission channels. At least one sequence is executed per configuration. The RF pulses of the at least one sequence are thereby respectively executed only at the transmission channel corresponding to the configuration or at the group of transmission channels corresponding to the configuration.

According to the prior art, in this case the problem solved by the present invention would occur with particular severity since the magnetization prepared by a channel group would affect the measurement of the channel group following this channel group, which would disadvantageously lead to an additional adulteration in the determination of the B1 magnetic field.

The present invention also encompasses a magnetic resonance system acquire MR data within a volume segment. The magnetic resonance system has a basic field magnet, a gradient field system, at least one RF transmission/reception antenna, at least one reception coil element, and a control device. The control device serves to control the gradient field system and the at least one RF transmission/reception antenna. The control device is designed in order to receive measurement signals that have been detected by the at least one RF transmission/reception antenna or by the at least on reception coil element. The magnetic resonance system is designed in order to implement the following sequence multiple times to acquire the MR data. For this purpose, the magnetic resonance system is designed in order to radiate first and second resonant RF pulses with the at least one RF antenna and to apply a dephasing first gradient with the gradient field system after the first resonant RF pulse and before the second resonant RF pulse. The control unit is designed to radiate a third resonant RF pulse with the at least one RF antenna after the second resonant RF pulse and to apply a second magnetic field gradient after the third RF pulse. The second magnetic field gradient refocuses a stimulated echo of a magnetization component prepared by the first gradient in order to read out MR data, and the control unit is designed to radiate a fourth resonant RF pulse after the readout of the MR data with the at least one RF antenna.

Moreover, the magnetic resonance system can be designed so as to operate the magnetic resonance system to implement the aforementioned method to determine the B1 magnetic field. For this purpose, the magnetic resonance system is designed in order to determine a first signal intensity of the stimulated echo and a second signal intensity of an echo of a free induction decay (of a gradient echo). The magnetic resonance system applies a third gradient with the gradient field system after the second gradient, this third gradient having a different polarity from the second gradient in order to refocus both the stimulated echo and the echo of the free induction decay. The magnetic resonance system is designed to detect the first signal intensity of the stimulated echo and the second signal intensity of the echo of the free induction decay upon readout of the MR data, and to determine an amplitude of the B1 magnetic field depending on the first signal intensity and the second signal intensity.

The advantages of the magnetic resonance system according to the invention essentially correspond to the advantages of the method according to the invention that have been described above.

Furthermore, the present invention also encompasses a non-transitory computer-readable storage medium that can be loaded into a memory of a programmable control device or a computer of a magnetic resonance system. The storage medium is encoded with programming instructions or commands that cause all embodiments or various embodiments of the method according to the invention described in the preceding to be executed when the programming instructions operate the control device. The storage medium may require program means (for example libraries and auxiliary functions) in order to realize the corresponding embodiments of the method.

The software (programming instructions) can be a source code ($C_{++}$, for example) that still needs to be compiled and linked or that only needs to be interpreted, or can be an executable software code that has only to be loaded into the corresponding computer or control device for execution.

The electronically readable data storage medium can be, for example a DVD, a magnetic tape or a USB stick on which is stored electronically readable control information.

Advantageously, systematic errors due to an incomplete T1 relaxation can be significantly reduced by the present invention in the MR data acquisition, and therefore also in the determination of the B1 magnetic field. The present invention enables a reduction of this measurement error without needing to wait for the complete T1 relaxation between successive sequences or, respectively, sequence executions, whereby the measurement time can advantageously be reduced and image artifacts can nevertheless be reduced.

The present invention is particularly suitable for diffusion imaging and for determination of the B1 magnetic field. Naturally, the present invention is not limited to this preferred field of application since the present invention can be used for virtually all methods based on the STEAM preparation. STEAM stands for "STimulated Echo Acquisition Mode".

DESCRIPTION OF THE PREFERRED EMBODIMENTS

Figure 1:
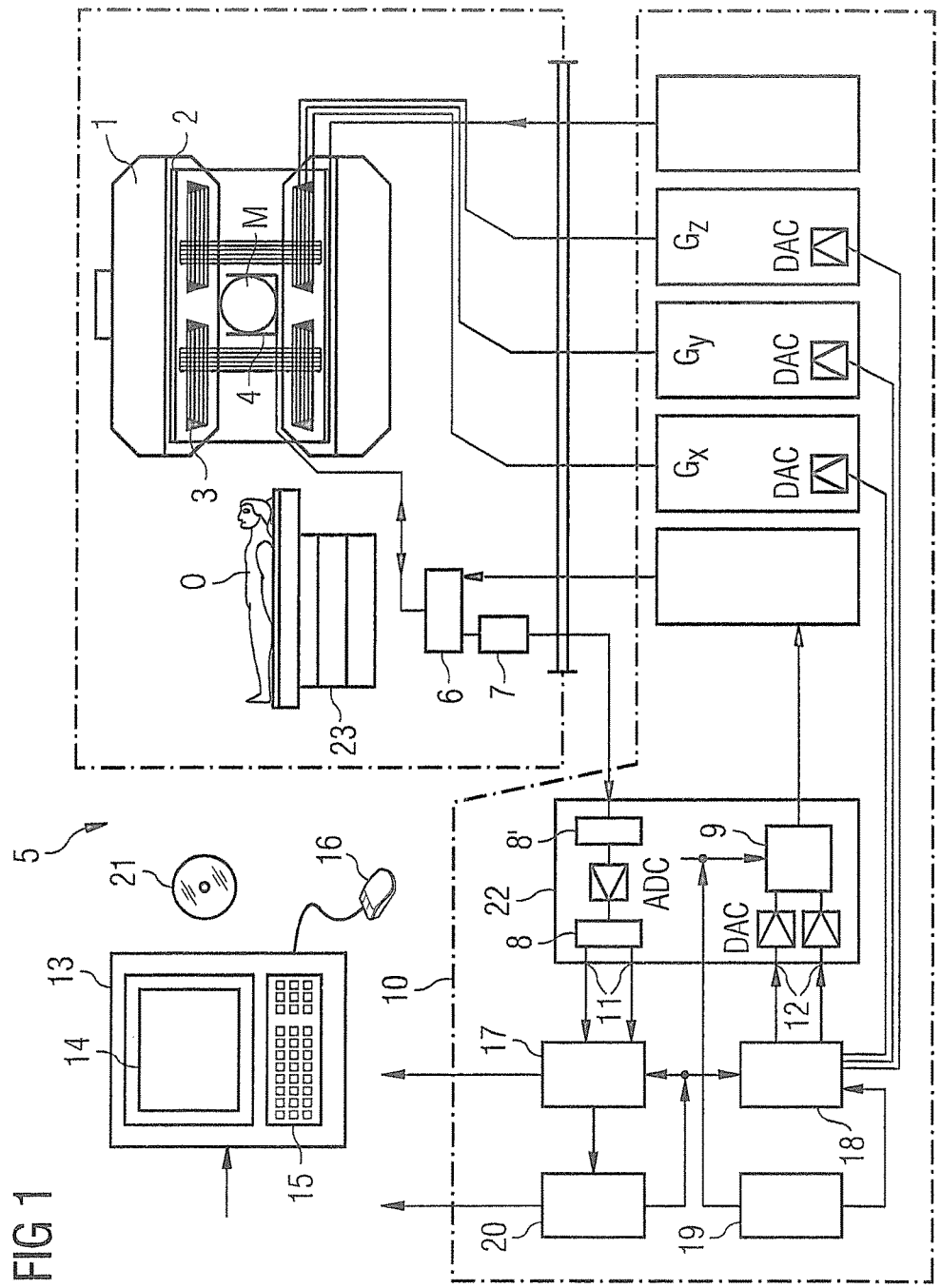
FIG. 1 schematically illustrates a magnetic resonance system according to the invention.

FIG. 1 is a schematic depiction of a magnetic resonance system 5 (a magnetic resonance or magnetic resonance tomography apparatus). A basic field magnet 1 generates a temporally constant, strong magnetic field for polarization or alignment of the nuclear spins in a volume segment of a subject O (for example of a part of a human body that is to be examined) which, lying on a table 23, is examined in the magnetic resonance system 5. The high homogeneity of the basic magnetic field that is required for the nuclear magnetic resonance measurement is defined in a typically spherical measurement volume M in which the parts of the human body that are to be examined are arranged. To support the homogeneity requirements, and in particular to eliminate temporally invariable influences, what are known as shim plates made of ferromagnetic material are mounted at a suitable location. Temporally variable influences are eliminated by shim coils 2 fed by a shim coils supply 25.

In the basic field magnet 1, a cylindrical gradient field system 3 is used that has three sub-windings. Each sub-winding is supplied by an amplifier with current to generate a linear (also temporally variable) gradient field in the respective direction of the Cartesian coordinate system. The first sub-winding of the gradient field system 3 generates a gradient $G_x$ in the x-direction, the second sub-winding generates a gradient $G_y$ in the y-direction, and the third sub-winding generates a gradient $G_z$ in the z-direction. Each amplifier includes a digital/analog converter which is controlled by a sequence controller 18 for time-accurate generation of gradient pulses.

Within the gradient field system 3 are situated one or more radio-frequency antennas 4, which convert the radio-frequency pulses emitted by a radio-frequency power amplifier 24 into an alternating magnetic field for excitation of the nuclei and alignment of the nuclear spins of the subject O to be examined, or of the region of the subject O that is to be examined, or which also detect an MR signal. Each radio-frequency antenna 4 has one or more RF transmission coils and one or more RF reception coils in the form of an annular (advantageously linear or matrix-like) arrangement of component coils. The alternating field emanating from the precessing nuclear spins—i.e. normally the nuclear spin echo signals caused by a pulse sequence comprised of one or more radio-frequency pulses and one or more gradient pulses—is also converted by the RF reception coils of the respective radio-frequency antenna 4 into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are thereby digitally represented in the sequence controller 18 as a series of complex numbers based on a pulse sequence predetermined by the system computer 20. This number sequence is supplied as a real part and imaginary part to a digital/analog converter in the radio-frequency system 22 via respective inputs 12, and from the digital/analog converter to a transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses (resonant and non-resonant) for excitation of the nuclear spins and for generation of the B1 magnetic field into the measurement volume M, and resulting echo signals are scanned via the RF reception coil(s). The acquired magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0, and the separation into real part and imaginary part, occur in a second demodulator 8 in the digital domain. An MR image or three-dimensional image data set (in a data file) is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR angiography image (which control programs are stored on a DVD 21, for example) and the presentation of the generated MR image take place via a terminal 13, which has a keyboard 15, a mouse 16 and a monitor 14.

Figure 2:
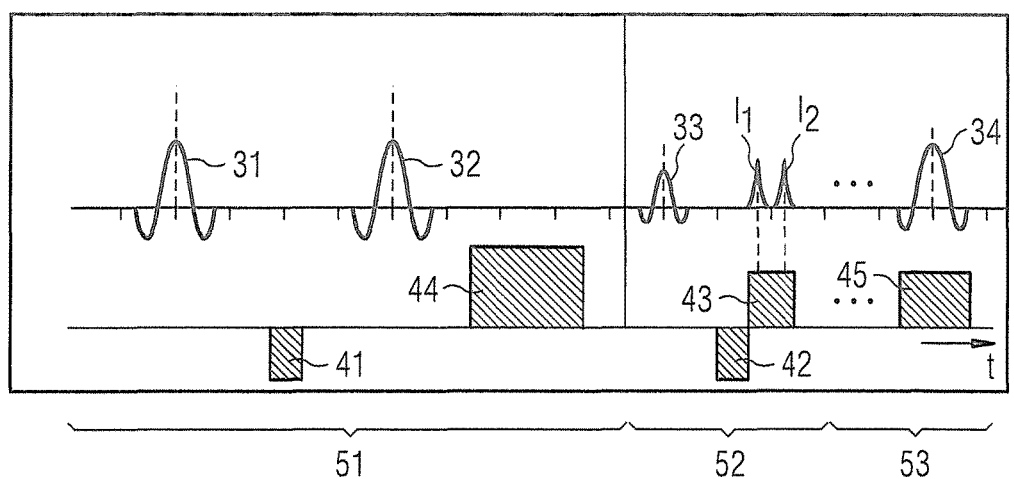
FIG. 2 shows a sequence diagram according to the invention.

The most important components of a sequence according to the invention for the determination of the B1 magnetic field are shown in FIG. 2. Each sequence can be subdivided into a preparation part 51, a readout part 52 and a dephasing part 53.

First, in the preparation part 51 a first resonant RF pulse 31 with a flip angle of at best 55° is radiated, which is followed by a second resonant RF pulse 32 (likewise with a flip angle of at best 55°). The magnetization is dephased between the two resonant RF pulses 31, 32 via application of a first gradient 41 with a first gradient moment.

The magnetization present after the second resonant RF pulse 32 is divided up into the following magnetic field components:
An unprepared longitudinal component which corresponds to the unprepared initial magnetization.
A prepared longitudinal component which has been dephased by the selected first gradient moment or, respectively, by the application of the first gradient 41, and thus has been prepared.
Transversal components.

The relative distribution of the magnetization among these components essentially depends on the deflection angles or flip angles that are generated by the two resonant RF pulses 31, 32 in the preparation part 51.

The transverse portions of the magnetization can be so strongly dephased by strong spoiler gradients 44 that they essentially no longer contribute to the signal or to the result (readout of the MR data) in the following readout portion 52.

A third resonant RF pulse 33 with a defined flip angle is now radiated to read out the MR data, which is followed by a second rephasing or refocusing gradient 42 with which a defined gradient moment is generated. The MR data are subsequently read out while an additional (readout) gradient 43 is switched. During the readout, the echo of the prepared longitudinal component (the stimulated echo) and the echo of the unprepared longitudinal component are successively refocused in the same readout portion 52 and detected in the form of a first signal intensity $I_1$ of the stimulated echo and a second signal intensity $I_2$ of the gradient echo (of the free induction decay).

For example, in order to read out a complete k-space the steps of the radiation of the third resonant RF pulse 33, radiation of the second gradient 42 and readout of the MR data given a switched gradient 43 can be repeated accordingly often. Only after the last readout portion 52 of the respective sequence has been executed is a fourth (final) resonant RF pulse 34 radiated at the end of the sequence (after the last readout portion 52), which fourth (final) resonant RF pulse 34 has a deflection angle that is greater than the deflection angle of the two resonant RF pulses 31, 32 of the preparation portion 51. This final RF pulse 34 is followed by a strong spoiler gradient 45. With the final resonant RF pulse 34, the longitudinal magnetization is converted into transversal magnetization which is dephased by the following strong spoiler gradient 45 so that it no longer contributes to a measurement signal in the following acquisitions or sequences.

It is noted that, in addition to the gradients 41-44 shown in FIG. 2, additional gradients (for example phase coding gradients, slice selection gradients or additional spoiler gradients) can be switched in arbitrary directions (for example for flux compensation).

Gradients 41-45 in the readout direction are depicted in FIG. 2. The preparation portion 51 can also be designated as a STEAM portion which, just like the dephasing portion 53, is executed only once per sequence. The number of repetitions of the readout portion 52 is determined by the desired number of phase coding steps.

Figure 3:
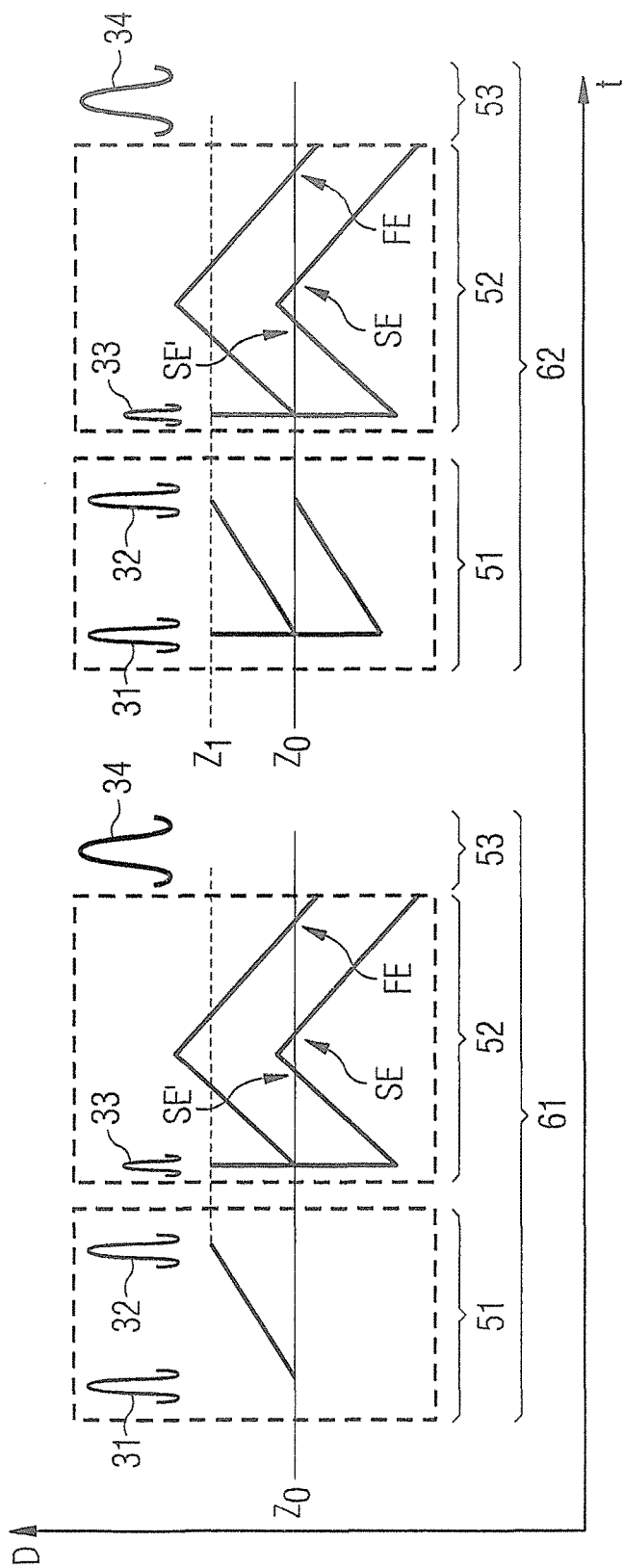
FIG. 3 shows various magnetization components which arise in the first and second input of a sequence according to the invention.

Defined magnetization components as well as their dephasing are schematically depicted in FIG. 3. $Z_0$ corresponds to the unprepared initial state or the originally present longitudinal magnetic field component, and $Z_1$ corresponds to the longitudinal magnetic field component prepared by the preparation portion 51. Longitudinal magnetic field components which are not affected by the gradient are shown traveling horizontally in FIG. 3. Transverse components proceed diagonally in FIG. 3, whereby the dephasing influence of gradients is shown.

By the radiation of the first resonant RF pulse 31, a transverse component is generated which is subsequently dephased by the first gradient moment 41 and therefore is prepared. A defined proportion of the transversal component is flipped in the longitudinal direction or, respectively, converted into a longitudinal component $Z_1$ with the second resonant RF pulse 32. Since longitudinal components are not affected by gradient moments, the proportion of the transversal component that is flipped in the longitudinal direction is essentially stored by the radiation of the second RF pulse 32 until at least a defined portion of the longitudinal magnetization is converted by means of the third resonant RF pulse 33 into a transverse magnetization again. A first stimulated echo SE' is generated via the application of the second gradient moment 42 at a defined point in time. Similarly, by the application of the third gradient moment 43 during the readout of the MR data a second stimulated echo (which is designated as the stimulated echo SE in the following) is detected, and the echo of the free induction decay FE in the form of signal intensities $I_1$, $I_2$ also is detected.

In the dephasing portion 53 of the first sequence 61, via the radiation of the fourth resonant RF pulse 34 and via subsequent application of a spoiler gradient (not shown in FIG. 3) the prepared longitudinal magnetization $Z_1$ that remains from the sequence is dephased and thus reduced in order to avoid (or at least reduce) an adulteration of measurement values in subsequent sequences 62.

If, according to the invention, a second sequence 62 is now introduced chronologically immediately after the first sequence 61, the longitudinal component prepared by the first sequence 61 (which longitudinal component could not be destroyed by the dephasing portion 53 of the first sequence 61) has not yet decayed, which is depicted in FIG. 3 in the form of the prepared longitudinal component $Z_1$ already present at the beginning of the second sequence 62. In other words: the goal of the dephasing portion 53 according to the invention is to keep the prepared longitudinal component $Z_1$ at the beginning of the next sequence 62 as small as possible in comparison to the unprepared longitudinal component $Z_0$.

Figure 4:
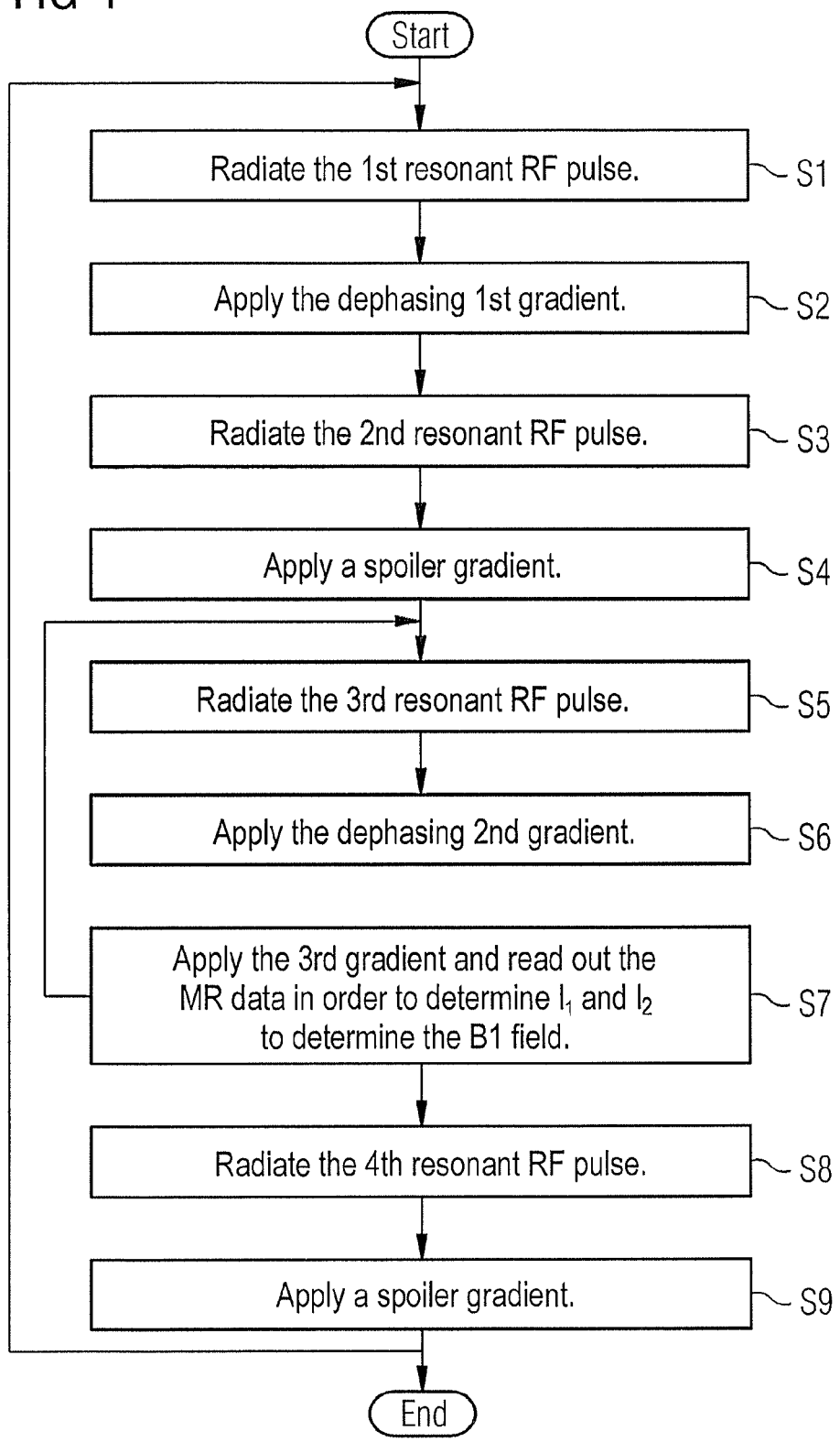
FIG. 4 is a flowchart of a method according to the invention to determine the B1 magnetic field.

A flow chart of a method according to the invention to determine the B1 magnetic field is presented in FIG. 4.

During a defined or arbitrary sequence, in a first Step S1 a first resonant RF pulse 31 is radiated, wherein a first dephasing gradient 41 is subsequently applied in a second Step S2 which is followed in a third Step S3 by a second resonant RF pulse 32. In order to destroy a transverse magnetization, in a fourth Step S4 a spoiler gradient 44 is applied. The Steps S1 through S4 belong to the preparation portion 51 of the sequence 61, 62.

The readout portion 52 of the sequence 61, 62 begins with Step S5 of the radiation of a third resonant RF pulse 33. In Step S6, a second gradient 42 is subsequently applied with the same polarity as the first gradient 41. During the readout of the MR data, in Step S7 a third gradient 43 is applied which has a polarity opposite that of the second gradient 42. Upon readout of the MR data, the first signal intensity $I_1$ and the second signal intensity $I_2$ are determined. Steps S5 through S7 are repeated arbitrarily often until the entirety of k-space has been read out, for example.

If the entirety of k-space has been registered, using the acquired MR data the first intensity $I_1$ and the second intensity $I_2$ can be determined for arbitrary points within the volume segment. Using the previously described Equations (1) and (2), the B1 amplitude for this location can now be calculated from the signal intensities $I_1$ and $I_2$ that are now calculated for an arbitrary location in the predetermined volume segment.

In order to now not adulterate the measurement values or signal intensities $I_1$, $I_2$ of a following sequence 62, at the end of the current sequence 61 a fourth resonant RF pulse 34 is applied in Step 68 and an additional spoiler gradient 45 is applied in Step S9 before the method according to the invention continues with a new sequence 62 (in Step S1).

Although modifications and changes may be suggested by those skilled in the art, it is the intention of the inventor to embody within the patent warranted hereon all changes and modifications as reasonably and properly come within the scope of his contribution to the art.

We claim as our invention:

1. A method to acquire magnetic resonance (MR) data, comprising:
    operating an MR data acquisition unit to repeatedly execute a sequence in a plurality of repetitions, said sequence interacting with nuclear spins in a volume segment of an examination subject situated in the MR data acquisition unit;
    operating said MR data acquisition unit, in each repetition of said sequence, to radiate a first resonant radio frequency (RF) pulse, radiate a second resonant RF pulse, apply a dephasing first gradient after said first resonant RF pulse and before said second resonant RF pulse, radiate a third resonant RF pulse after the second resonant RF pulse, apply a second gradient after the third resonant RF pulse that refocuses a stimulated echo of a magnetization component prepared by the dephasing first gradient, reading out said MR data, and radiating a fourth resonant RF pulse after reading out said MR data that reduces longitudinal magnetization of said nuclear spins; and
    in a processor, compiling the MR data from the respective repetitions in a data file, and making the data file available at an output of the processor in electronic form.

2. A method as claimed in claim 1 wherein said volume segment comprises a slice, and comprising operating said MR data acquisition unit to apply a slice selection gradient during said first resonant RF pulse, during said second resonant RF pulse, during said third resonant RF pulse, and during said fourth resonant RF pulse.

3. A method as claimed in claim 1 wherein said volume segment is a three-dimensional volume segment, and comprising exciting nuclear spins in an entirety of said three-dimensional volume segment with each of said first resonant RF pulse, said second resonant RF pulse, said third resonant RF pulse, and said fourth resonant RF pulse.

4. A method as claimed in claim 1 comprising operating said MR data acquisition unit to apply a spoiler gradient, after said second resonant RF pulse and before said third resonant RF pulse, that dephases transverse components of magnetization of said nuclear spins.

5. A method as claimed in claim 4 comprising applying an additional spoiler gradient after said fourth resonant RF pulse that dephases transverse components of said magnetization of said nuclear spins.

6. A method as claimed in claim 1 comprising radiating said third resonant RF pulse and applying said second gradient and reading out said MR data multiple times in each repetition before radiating said fourth resonant RF pulse.

7. A method to determine a B1 magnetic field within a volume segment in a magnetic resonance (MR) system, comprising:

operating an MR data acquisition unit to repeatedly execute a sequence in a plurality of repetitions, said sequence interacting with nuclear spins in a volume segment of an examination subject situated in the MR data acquisition unit;

operating said MR data acquisition unit, in each repetition of said sequence, to radiate a first resonant radio frequency (RF) pulse, radiate a second resonant RF pulse, apply a dephasing first gradient after said first resonant RF pulse and before said second resonant RF pulse, radiate a third resonant RF pulse after the second resonant RF pulse, apply a second gradient after the third resonant RF pulse that refocuses a stimulated echo of a magnetization component prepared by the dephasing first gradient, apply a third gradient after said second gradient, said third gradient having a polarity different from a polarity of the second gradient and said third gradient refocusing said stimulated echo and an echo of free induction decay, reading out said MR data, and radiating a fourth resonant RF pulse after reading out said MR data that reduces longitudinal magnetization of said nuclear spins;

providing said MR data from each of said repetitions to a processor and, in said processor, automatically determining a first signal intensity of said stimulated echo and a second signal intensity of said echo of said free induction decay; and in said processor, automatically determining an amplitude of a B1 magnetic field in said volume segment from said first signal intensity and said second signal intensity, and emitting an electronic signal representing said amplitude of said B1 magnetic field at an output of said processor.

8. A method as claimed in claim 7 comprising operating said MR data acquisition unit to radiate said first resonant RF pulse and to radiate said second resonant RF pulse with a same flip angle.

9. A method as claimed in claim 8 comprising operating said MR data acquisition unit to radiate said first resonant RF pulse and said second resonant RF pulse with said same flip angle in a range between 45 degrees and 65 degrees.

10. A method as claimed in claim 9 comprising operating said MR data acquisition unit to radiate said fourth resonant RF pulse with a flip angle of 90 degrees.

11. A method as claimed in claim 7 comprising operating said MR data acquisition unit to radiate said fourth resonant RF pulse with a flip angle of 90 degrees.

12. A method as claimed in claim 7 comprising operating said MR data acquisition unit to radiate said first, second, third and fourth resonant RF pulses with respective flip angles, and setting the respective flip angles to have a relationship selected from the group consisting of the flip angle of the fourth resonant RF pulse equals the flip angle of the first resonant RF pulse, the flip angle of the fourth resonant RF pulse equals the flip angle of the second resonant RF pulse, the flip angle of the fourth resonant RF pulse is greater than the flip angle of the first resonant RF pulse.

13. A magnetic resonance (MR) apparatus comprising:
an MR data acquisition unit;
a control unit configured to operate said MR data acquisition unit to repeatedly execute a sequence in a plurality of repetitions, said sequence interacting with nuclear spins in a volume segment of an examination subject situated in the MR data acquisition unit;

said control unit being configured operate said MR data acquisition unit, in each repetition of said sequence, to radiate a first resonant radio frequency (RF) pulse, radiate a second resonant RF pulse, apply a dephasing first gradient after said first resonant RF pulse and before said second resonant RF pulse, radiate a third resonant RF pulse after the second resonant RF pulse, apply a second gradient after the third resonant RF pulse that refocuses a stimulated echo of a magnetization component prepared by the dephasing first gradient, reading out said MR data, and radiating a fourth resonant RF pulse after reading out said MR data that reduces longitudinal magnetization of said nuclear spins; and a processor configured to compile the MR data from the respective repetitions in a data file, and to make the data file available at an output of the processor in electronic form.

14. A magnetic resonance (MR) apparatus comprising:
an MR data acquisition unit;
a control unit configured to operate said MR data acquisition unit to repeatedly execute a sequence in a plurality of repetitions, said sequence interacting with nuclear spins in a volume segment of an examination subject situated in the MR data acquisition unit;

said control unit being configured operate said MR data acquisition unit, in each repetition of said sequence, to radiate a first resonant radio frequency (RF) pulse, radiate a second resonant RF pulse, apply a dephasing first gradient after said first resonant RF pulse and before said second resonant RF pulse, radiate a third resonant RF pulse after the second resonant RF pulse, apply a second gradient after the third resonant RF pulse that refocuses a stimulated echo of a magnetization component prepared by the dephasing first gradient, apply a third gradient after said second gradient, said third gradient having a polarity different from a polarity of the second gradient and said third gradient refocusing said stimulated echo and an echo of free induction decay, reading out said MR data, and radiating a fourth resonant RF pulse after reading out said MR data that reduces longitudinal magnetization of said nuclear spins;

a processor provided with said MR data from each of said repetitions, said processor being configured to automatically determine a first signal intensity of said stimulated echo and a second signal intensity of said echo of said free induction decay; and said processor being configured to automatically determine an amplitude of a B1 magnetic field in said volume segment from said first signal intensity and said second signal intensity, and to emit an electronic signal representing said amplitude of said B1 magnetic field at an output of said processor.

15. A non-transitory, computer-readable data storage medium encoded with programming instructions, said storage medium being loaded into a computerized control and processing system of a magnetic resonance (MR) apparatus, said MR apparatus comprising an MR data acquisition unit, and said programming instructions causing said control and processing system to:

operate said MR data acquisition unit to repeatedly execute a sequence in a plurality of repetitions, said sequence interacting with nuclear spins in a volume segment of an examination subject situated in the MR data acquisition unit;

operate said MR data acquisition unit, in each repetition of said sequence, to radiate a first resonant radio frequency (RF) pulse, radiate a second resonant RF pulse, apply a dephasing first gradient after said first resonant RF pulse and before said second resonant RF pulse, radiate a third resonant RF pulse after the second resonant RF pulse, apply a second gradient after the third resonant RF pulse that refocuses a stimulated echo of a magnetization component prepared by the dephasing first gradient, reading out said MR data, and radiating a fourth resonant RF pulse after reading out said MR data that reduces longitudinal magnetization of said nuclear spins; and compile the MR data from the respective repetitions in a data file, and make the data file available at an output of the processor in electronic form.

16. A non-transitory, computer-readable data storage medium encoded with programming instructions, said storage medium being loaded into a computerized control and processing system of a magnetic resonance (MR) apparatus, said MR apparatus comprising an MR data acquisition unit, and said programming instructions causing said control and processing system to:

operate said MR data acquisition unit to repeatedly execute a sequence in a plurality of repetitions, said sequence interacting with nuclear spins in a volume segment of an examination subject situated in the MR data acquisition unit;

operate said MR data acquisition unit, in each repetition of said sequence, to radiate a first resonant radio frequency (RF) pulse, radiate a second resonant RF pulse, apply a dephasing first gradient after said first resonant RF pulse and before said second resonant RF pulse, radiate a third resonant RF pulse after the second resonant RF pulse, apply a second gradient after the third resonant RF pulse that refocuses a stimulated echo of a magnetization component prepared by the dephasing first gradient, apply a third gradient after said second gradient, said third gradient having a polarity different from a polarity of the second gradient and said third gradient refocusing said stimulated echo and an echo of free induction decay, reading out said MR data, and radiating a fourth resonant RF pulse after reading out said MR data that reduces longitudinal magnetization of said nuclear spins;

from said MR data from each of said repetitions, determine a first signal intensity of said stimulated echo and a second signal intensity of said echo of said free induction decay; and determine an amplitude of a B1 magnetic field in said volume segment from said first signal intensity and said second signal intensity, and emit an electronic signal representing said amplitude of said B1 magnetic field at an output of said processor.

* * * * *